United States Patent
Kim

(10) Patent No.: US 7,043,676 B2
(45) Date of Patent: *May 9, 2006

(54) APPARATUS AND METHOD FOR CODING/DECODING CHANNELS IN A MOBILE COMMUNICATION SYSTEM

(75) Inventor: Jae-Yoel Kim, Kunpo-shi (KR)

(73) Assignee: Samsung Electronics Co., LTD, (KR)

( * ) Notice: Subject to any disclaimer, the term of this patent is extended or adjusted under 35 U.S.C. 154(b) by 554 days.

This patent is subject to a terminal disclaimer.

(21) Appl. No.: 10/076,156

(22) Filed: Feb. 14, 2002

(65) Prior Publication Data

US 2002/0112210 A1 Aug. 15, 2002

(30) Foreign Application Priority Data

Feb. 15, 2001 (KR) ................... 2001-7625
Feb. 15, 2001 (KR) ................... 2001-7628

(51) Int. Cl.
*H03M 13/00* (2006.01)

(52) U.S. Cl. ....................... 714/752; 714/790

(58) Field of Classification Search ............... 714/752, 714/755, 790, 762, 780, 784; 341/107; 375/262, 375/340; 370/208
See application file for complete search history.

(56) References Cited

U.S. PATENT DOCUMENTS

2002/0075838 A1 6/2002 Choi et al.

2002/0114268 A1 8/2002 Kim et al.

FOREIGN PATENT DOCUMENTS

| WO | WO 00/19739 | 4/2000 |
|---|---|---|
| WO | WO 01/03366 | 1/2001 |
| WO | WO 01/03366 A1 | 1/2001 |
| WO | WO 02/15409 | 2/2002 |
| WO | WO 02/15409 A1 | 2/2002 |
| WO | WO 02/32016 | 4/2002 |

OTHER PUBLICATIONS

An updated Table of Minimum-Distance Bounds For Binary Linear Codes (A.E. Brouwer and Tom Verhoeff, IEEE Transactions On Information Theory, vol. 39, No. 2, Mar. 1993.

(Continued)

*Primary Examiner*—Albert Decady
*Assistant Examiner*—Dipakkumar Gandhi
(74) *Attorney, Agent, or Firm*—Dilworth & Barrese LLP

(57) ABSTRACT

A CDMA mobile communication system determines the number of input information bits (5 bit) and the number of symbols to be punctured, and encodes/decodes the input information bits (5 bits). A transmitter encodes the input information bits into 16 coded symbols with a first order Reed-Muller code, and punctures four coded symbols from the 16 coded symbols so as to generate a codeword having the minimum distance. A receiver then receives punctured coded symbols, i.e., the codeword, and inserts zero (0) bits at the punctured positions. Further, the receiver calculates reliabilities between the zero-inserted coded symbols with all of first order Reed-Muller codewords, and outputs input information bits for the coded symbols corresponding to the highest reliability.

28 Claims, 6 Drawing Sheets

OTHER PUBLICATIONS

U.K. Combined Search and Examination Report dated Oct. 24, 2002 issued in a counterpart application, namely, Appln. No. GB 0203643.2.

French Search Report dated Mar. 4, 2003, issued in a counterpart application, namely, Appln. No. 0201851000.

A.E. Brouwer et al. "An Updated Table of Minimum-Distance Bounds for Binary Linear Codes", IEEE Transactions on Information Theory, 1993, pp. 662-677.

European Search Report dated Apr. 2, 2003, issued in a counterpart application, namely, Appln. No. 02003581.2.

"ETSI TS 125 Universal Mobile Telecommunications System (UMTS)," Multiplexing and Channel Coding (FDD), Dec. 2000, pp. 8-55.

F. J. MacWilliams et al., "The Theory of Error-Correcting Codes." 1993, p. 28, 29, 372, and 373.

A.E. Brouwer et al., "An Updated Table of Minimum-Distance Bounds for Binary Linear Codes," IEEE Transactions on Information Theory, IEEE, New York, US, vol. 39, No. 2, Mar. 1, 1993, pp. 662-677.

APPARATUS AND METHOD FOR CODING/DECODING CHANNELS IN A MOBILE COMMUNICATION SYSTEM

PRIORITY

This application claims priority to an application entitled "Apparatus and Method for Coding/Decoding Channels in a Mobile Communication System" filed in the Korean Industrial Property Office on Feb. 15, 2001 and assigned Ser. No. 2001-7625, and an application entitled "Apparatus and Method for Coding/Decoding Channels in a Mobile Communication System" filed in the Korean Industrial Property Office on Feb. 15, 2001 and assigned Ser. No. 2001-7628, the contents of which are hereby incorporated by reference.

BACKGROUND OF THE INVENTION

1. Field of the Invention

The present invention relates generally to coding/decoding technology in a communication system, and in particular, to a coding/decoding apparatus and method for a CDMA (Code Division Multiple Access) mobile communication system using an error correcting code.

2. Description of the Related Art

An IMT-2000 (International Mobile Telecommunication-2000) system, a future CDMA mobile communication system, transmits user data for a voice service, an image service and a data service, along with control data for performing the services. It is important to minimize errors occurring during the transmission of such data in order to improve the quality of the services. To this end, error correcting codes for correcting data bit errors are used to minimize the errors occurring during transmission of the data. Since using the error correcting codes is aimed at minimizing the data bit errors of the transmission data, it is very important to use optimal error correcting codes.

Typically, linear codes are used for the error correcting codes, because it is easy to analyze their performances. Hamming distance distribution for codewords of the error correcting codes serve as a measure indicating the performance of the linear codes. The "Hamming distance" is the consecutive number of non-zero symbols in a codeword. That is, for a certain codeword '0111', the consecutive number of 1's included in the codeword is 3, so that the Hamming distance is 3. The smallest value among the Hamming distance values is called a "minimum distance", and an increase in the minimum distance of the codeword improves the error correcting performance of the codeword. In other words, the "optimal code" means a code having the optimal error correcting performance.

A paper, *An Updated Table of Minimum-Distance Bounds for Binary Linear Codes* (A. E. Brouwer and Tom Verhoeff, IEEE Transactions on information Theory, VOL 39, NO. 2, March 1993), discloses an intercode minimum distance, which depends on the input and output values of the binary liner codes and is adapted to generate optimal codes depending on the number of coded symbols generated by encoding input information bits.

The paper discloses a (12,5) linear code for which the number of input information bits is 5 and the number of output coded symbols is 12, and its optimal code has the minimum distance of 4. Therefore, when using the (12,5) linear code, it is necessary to consider both using the optimal code having the minimum distance of 4 and creating the optimal code having the minimum distance of 4, while at the same time, minimizing hardware complexity.

In addition, the paper discloses a (24,6) linear code for which the number of input information bits is 6 and the number of output coded symbols is 24. Its optimal code has the minimum distance of 10. Therefore, when using the (24,6) linear code, it is necessary to consider both using the optimal code having the minimum distance of 10 and creating the optimal code having the minimum distance of 10 while minimizing hardware complexity.

SUMMARY OF THE INVENTION

It is, therefore, an object of the present invention to provide a coding apparatus and method for creating an optimal (12,5) codeword in a mobile communication system using an error correcting code.

It is another object of the present invention to provide an apparatus and method for determining puncturing positions used in creating an optimal (12,5) codeword by puncturing a first order Reed-Muller codeword comprised of 16 coded symbols.

It is further another object of the present invention to provide an apparatus and method for decoding a received (12,5) codeword in a mobile communication system using an error correction code.

It is yet another object of the present invention to provide a coding apparatus and method for creating an optimal (24,6) codeword in a mobile communication system using an error correcting code.

It is still another object of the present invention to provide an apparatus and method for determining puncturing positions used in creating an optimal (24,6) codeword by puncturing a first order Reed-Muller codeword comprised of 32 coded symbols.

It is still another object of the present invention to provide an apparatus and method for decoding a received (24,6) codeword in a mobile communication system using an error correcting code.

According to a first aspect of the present invention, there is provided an apparatus for coding a 5-bit input information bit stream into a (12,5) codeword comprised of 12 coded symbols. The apparatus comprises a Reed-Muller encoder for receiving the input information bit stream and creating a first order Reed-Muller codeword comprised of 16 coded symbols; and a puncturer for outputting an optimal (12,5) codeword by puncturing 4 consecutive coded symbols from a stream of the 16 coded symbols comprising the first order Reed-Muller codeword, beginning at a coded symbol selected from $1^{st}$, $3^{rd}$, $5^{th}$, $7^{th}$, $9^{th}$ and $11^{th}$ coded symbols.

According to a second aspect of the present invention, there is provided an apparatus for coding a 5-bit input information bit stream into a (12,5) codeword comprised of 12 coded symbols. The apparatus comprises a Reed-Muller encoder for receiving the input information bit stream and generating a first order Reed-Muller codeword comprised of 16 coded symbols; and a puncturer for outputting an optimal (12,5) codeword by puncturing a selected coded symbol out of $2^{nd}$, $3^{rd}$, $6^{th}$ and $7^{th}$ coded symbols from a stream of the 16 coded symbols comprising the first order Reed-Muller codeword, and also puncturing 3 coded symbols at intervals of 2 symbols beginning at the selected coded symbol.

According to a third aspect of the present invention, there is provided an apparatus for coding a 5-bit input information bit stream into a (12,5) codeword comprised of 12 coded symbols. The apparatus comprises a Reed-Muller encoder for receiving the input information bit stream and generating a first order Reed-Muller codeword comprised of 16 coded symbols; and a puncturer for outputting an optimal (12,5)

codeword by puncturing a selected coded symbol out of $0^{th}$, $1^{st}$, $2^{nd}$, $4^{th}$, $5^{th}$ and $6^{th}$ coded symbols from a stream of the 16 coded symbols comprising the first order Reed-Muller codeword, and also puncturing 3 coded symbols at intervals of 3 symbols beginning at the selected coded symbol.

According to a fourth aspect of the present invention, there is provided an apparatus for coding a 6-bit input information bit stream into a (24,6) codeword comprised of 24 coded symbols. The apparatus comprises a Reed-Muller encoder for receiving the input information bit stream and generating a first order Reed-Muller codeword comprised of 32 coded symbols; and a puncturer for outputting an optimal (24,6) codeword by selecting a coded symbol out of $2^{nd}$, $6^{th}$ and $10^{th}$ coded symbols from a stream of the 32 coded symbols comprising the first order Reed-Muller codeword, and puncturing the selected coded symbol, 6 coded symbols at intervals of 3 symbols beginning at the selected coded symbol, and also puncturing a coded symbol at an interval of 1 symbol beginning at a last symbol out of the 6 punctured coded symbols.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 1:
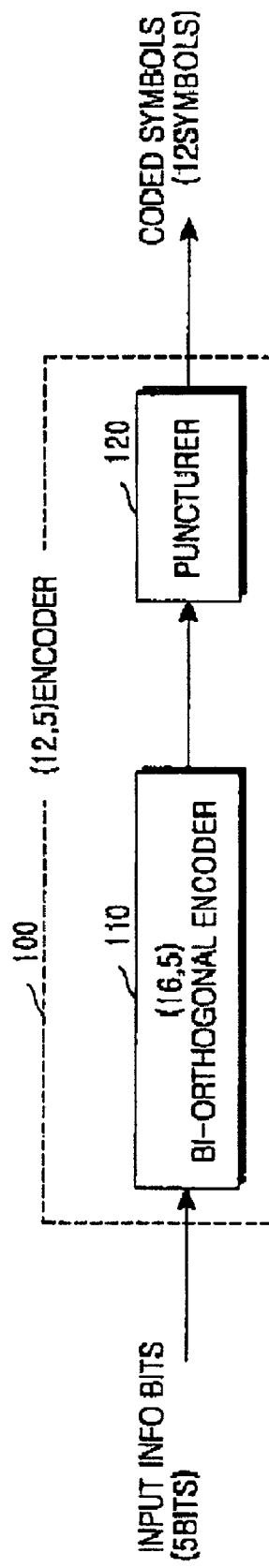
FIG. 1 illustrates a structure of a coding apparatus according to a first embodiment of the present invention.

A preferred embodiment of the present invention will be described herein below with reference to the accompanying drawings. In the following description, well-known functions or constructions are not described in detail since they would obscure the invention in unnecessary detail.

The present invention provides two different embodiments. A first embodiment realizes a coding apparatus for creating an optimal (12,5) codeword and a decoding apparatus for decoding the created (12,5) codeword in a mobile communication system using an error correcting code. A second embodiment realizes a coding apparatus for creating an optimal (24,6) codeword and a decoding apparatus for decoding the created (24,6) codeword in a mobile communication system using an error correcting code. The embodiments create an optimal codeword by puncturing symbols at specific locations among the coded symbols comprising a first order Reed-Muller codeword. The first embodiment creates a first order Reed-Muller codeword comprised of 16 coded symbols by receiving an information bit stream comprised of 5 bits, and then creates a (12,5) codeword by puncturing 4 coded symbols from the 16 coded symbols. The second embodiment creates a first order Reed-Muller codeword comprised of 32 coded symbols by receiving an information bit stream comprised of 6 bits, and then creates a (24,6) codeword by puncturing 8 coded symbols from the 32 coded symbols.

First Embodiment

The first embodiment of the present invention provides a scheme for creating a codeword by using a (12,5) linear code as an optimal error correcting code for the CDMA mobile communication system and then decoding the created (12,5) codeword. For example, the first embodiment uses as an error correcting code, a (12,5) first order Reed-Muller code obtained by puncturing 4 symbols from 16 coded symbols comprising a first order Reed-Muller codeword with a length 16. Although there are innumerable ways to create the (12,5) first order Reed-Muller code, it is possible not only to minimize hardware complexity but also to create an optimal codeword by utilizing the method of creating a first order Reed-Muller code and then puncturing the created first order Reed-Muller code as in the first embodiment of the present invention. A drastic reduction in a length of the first order Reed-Muller code contributes to minimization of the hardware complexity. In addition, it is not only possible to minimize the hardware complexity but also to create a code optimized for error correcting performance, by puncturing the first order Reed-Muller codeword. As stated above, the embodiment of the present invention uses the first order Reed-Muller code as an error correcting code, and herein, a bi-orthogonal codeword is used for the first order Reed-Muller code.

As stated above, the (12,5) codeword is created by puncturing 4 symbols from 16 coded symbols (bi-orthogonal code symbols) comprising a first order Reed-Muller codeword with a length 16. A minimum distance $d_{min}$ of the codeword depends upon the puncturing positions where the 4 symbols are punctured from the 16 bi-orthogonal code symbols. As previously mentioned, the minimum distance of a codeword refers to the smallest value among the Hamming distance values of the codeword, and an increase in the minimum distance improves error correcting performance of a linear error correcting code. Therefore, it is important to determine proper puncturing positions in order to create a (12,5) bi-orthogonal codeword having excellent error correcting performance in the first order Reed-Muller codeword with a length 16.

Puncturing patterns for the 4 puncturing positions needed to create an optimal (12,5) codeword can be experimentally calculated. There are 16 typical puncturing patterns: {1, 2, 3, 4}, {3, 4, 5, 6}, {5, 6, 7, 8}, {7, 8, 9, 10}, {9, 10, 11, 12}, {11, 12, 13, 14}, {2, 4, 6, 8}, {3, 5, 7, 9}, {6, 8, 10, 12}, {7, 9, 11, 13}, {0, 3, 6, 9}, {1, 4, 7, 10}, {2, 5, 8, 11}, {4, 7, 10, 13}, {5, 8, 11, 14}, and {6, 9, 12, 15}. A first order Reed-Muller codeword is comprised of 16 coded symbols of $0^{th}$ to $15^{th}$ coded symbols. For example, the puncturing pattern {1, 2, 3, 4} is a puncturing pattern for puncturing 4 consecutive coded symbols from the 16 coded symbols comprising the first order Reed-Muller codeword at an interval of 1 symbol, beginning at a $1^{st}$ coded symbol. The puncturing pattern {2, 4, 6, 8} is a puncturing pattern for puncturing 4 coded symbols from the 16 coded symbols comprising the first order Reed-Muller codeword at intervals of 2 symbols, beginning at a $2^{nd}$ coded symbol. The puncturing pattern {0, 3, 6, 9} is a puncturing pattern for puncturing 4 coded symbols from the 16 coded symbols comprising the first order Reed-Muller codeword at intervals of 3 symbols, beginning at a $0^{th}$ coded symbol. In this way, the 16 puncturing patterns have their own regularities. In the 6 puncturing patterns {1, 2, 3, 4}, {3, 4, 5, 6}, {5, 6, 7, 8}, {7, 8, 9, 10}, {9, 10, 11, 12}, and {11, 12, 13, 14}, the puncturing positions of the coded symbols have an equal interval of 1. In the 4 puncturing patterns {2, 4, 6, 8}, {3, 5, 7, 9}, {6, 8, 10, 12}, and {7, 9, 11, 13}, the puncturing positions of the coded symbols have an equal interval of 2. In the 6 puncturing patterns {0, 3, 6, 9}, {1, 4, 7, 10}, {2, 5, 8, 11}, {4, 7, 10, 13}, {5, 8, 11, 14}, and {6, 9, 12, 15}, the puncturing positions of the coded symbols have an equal interval of 3. If a transmitter of the mobile communication system uses the puncturing patterns having the regularities during coding, a receiver associated with the transmitter should also use the puncturing patterns having the same regularities during decoding by previous agreement. This agreement is generally prescribed by a communication protocol. However, it is also possible for the transmitter to inform the receiver of the puncturing positions.

FIG. 1 illustrates a structure of a coding apparatus according to a first embodiment of the present invention. Referring to FIG. 1, a coding apparatus according to an embodiment of the present invention utilizes a (12,5) encoder 100 for outputting 12 coded symbols by receiving a 5-bit information bit stream. The (12,5) encoder 100 includes a (16,5) bi-orthogonal encoder 110 and a puncturer 120. The bi-orthogonal encoder (Reed-Muller encoder) 110 in the (12,5) coding apparatus 100 encodes a 5-bit input information bit stream of a0, a1, a2, a3 and a4 into a first order Reed-Muller codeword (a stream of coded symbols) of length 16. The puncturer 120 receives the stream of the coded symbols of length 16, output from the bi-orthogonal encoder 110, and punctures 4 coded symbols at the puncturing positions corresponding to a predetermined puncturing pattern, from the coded symbols of length 16. As a result, the puncturer 120 outputs a stream of 12 coded symbols, an optimal (12,5) codeword.

For example, when using a puncturing pattern in which the puncturing positions have an interval of 1, the puncturer 120 punctures 4 consecutive coded symbols from the stream of 16 coded symbols comprising a first order Reed-Muller codeword, beginning at selected one of $1^{st}$, $3^{rd}$, $5^{th}$, $7^{th}$, $9^{th}$ and $11^{th}$ coded symbols. When the $1^{st}$ coded symbol is selected from the stream of the 16 coded symbols comprising the first order Reed-Muller codeword, the puncturer 120 punctures $1^{st}$, $2^{nd}$, $3^{rd}$ and $4^{th}$ coded symbols. When the $3^{rd}$ coded symbol is selected from the stream of the 16 coded symbols comprising the first order Reed-Muller codeword, the puncturer 120 punctures $3^{rd}$, $4^{th}$, $5^{th}$ and $6^{th}$ coded symbols. When the $5^{th}$ coded symbol is selected from the stream of the 16 coded symbols comprising the first order Reed-Muller codeword, the puncturer 120 punctures $5^{th}$, $6^{th}$, $7^{th}$ and $8^{th}$ coded symbols. When the $7^{th}$ coded symbol is selected from the stream of the 16 coded symbols comprising the first order Reed-Muller codeword, the puncturer 120 punctures $7^{th}$, $8^{th}$, $9^{th}$ and $10^{th}$ coded symbols. When the $9^{th}$ coded symbol is selected from the stream of the 16 coded symbols comprising the first order Reed-Muller codeword, the puncturer 120 punctures $9^{th}$, $10^{th}$, $11^{th}$ and $12^{th}$ coded symbols. Finally, when the $11^{th}$ coded symbol is selected from the stream of the 16 coded symbols comprising the first order Reed-Muller codeword, the puncturer 120 punctures $11^{th}$, $12^{th}$, $13^{th}$ and $14^{th}$ coded symbols.

Figure 2:
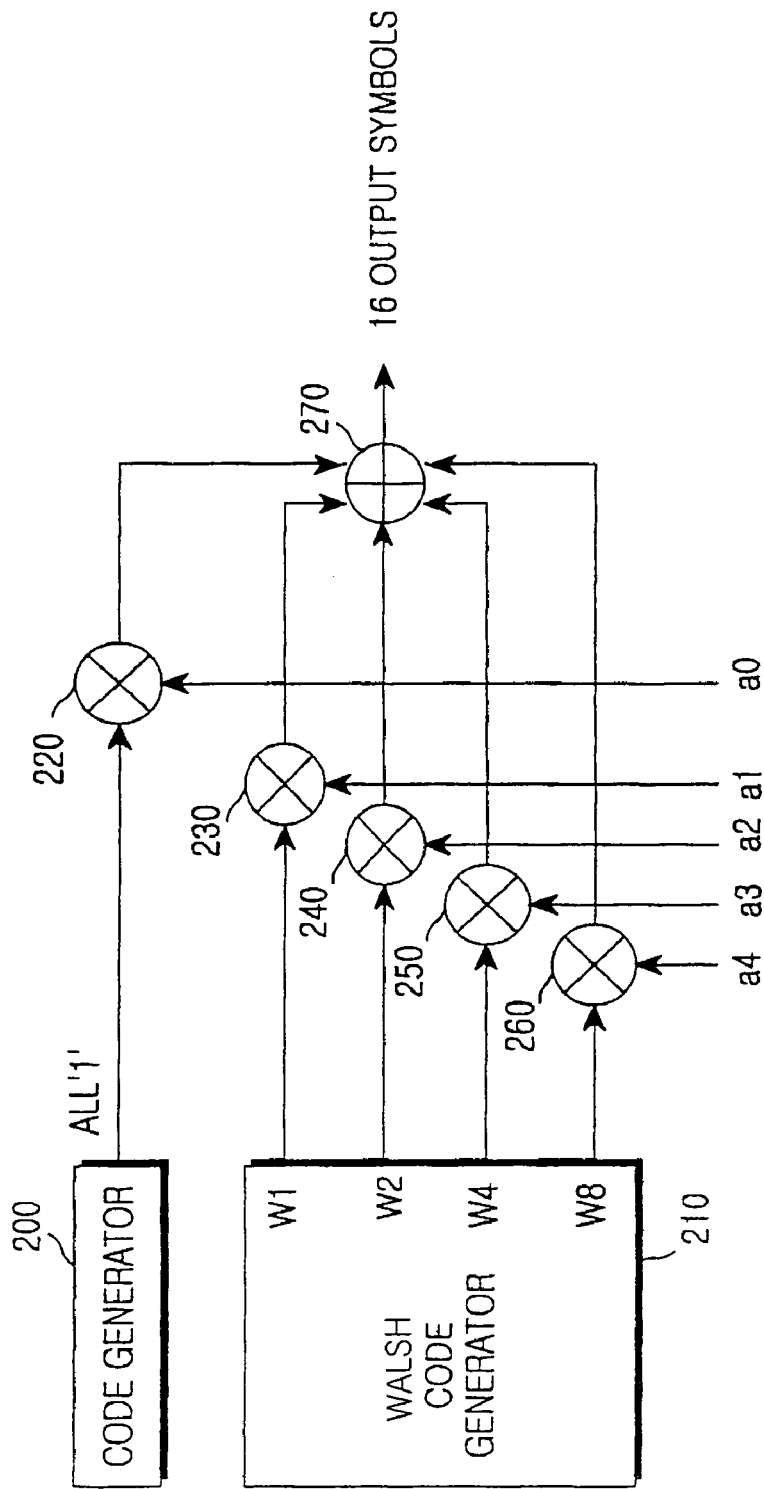
FIG. 2 illustrates a detailed structure of the Reed-Muller encoder shown in FIG. 1.

FIG. 2 illustrates a detailed structure of the Reed-Muller encoder 110 shown in FIG. 1. Referring to FIG. 2, the Reed-Muller encoder 110 includes an orthogonal codeword generator comprised of a Walsh code generator 210 and multipliers 230–260; an All 1's code generator 200 and a multiplier 220; and an adder 270. The orthogonal codeword generator generates orthogonal codewords each comprised of 16 coded symbols by multiplying 4 bits out of the 5-bit input information bit stream by associated base orthogonal codes W1, W2, W4 and W8. The orthogonal codeword generator is comprised of the Walsh code generator 210 for generating a Walsh code, a typical orthogonal code, and the multipliers 230–260. The code generator 200 generates the All 1's code and the All 1's code is multiplied by the remaining one bit of the input information bit stream at the multiplier 200. The adder 270 outputs a phase inverted codeword of the orthogonal codewords, a first order Reed Muller codeword, by exclusively ORing (XORing) the codewords output from the multiplier 220 and the orthogonal codewords.

The 5 input information bits a0, a1, a2, a3 and a4 are provided to the multipliers 220, 230, 240, 250 and 260, respectively. The code generator 200 generates an all 1's code and the Walsh code generator 210 simultaneously generates length=16 Walsh codes W1, W2, W4 and W8. The all 1's code and the Walsh codes W1, W2, W4 and W8 are also provided to the associated multipliers 220, 230, 240, 250 and 260, respectively. That is, the all 1's code is applied to the multiplier 220, the Walsh code W1 to the multiplier 230, the Walsh code W2 to the multiplier 240, the Walsh code W4 to the multiplier 250, and the Walsh code W8 to the multiplier 260. Here, the code generator 200 generates the all 1's code in order to create a bi-orthogonal code by converting an orthogonal code to a phase-inverted orthogonal code. Other codes can also be used, if they can be used in creating a bi-orthogonal code by converting the orthogonal code to a phase-inverted orthogonal code.

The multiplier 220 multiplies the input information bit a0 by the all 1's code in a symbol unit. The multiplier 230 multiplies the input information bit a1 by the Walsh code W1 in a symbol unit. The multiplier 240 multiplies the input information bit a2 by the Walsh code W2 in a symbol unit. The multiplier 250 multiplies the input information bit a3 by the Walsh code W4 in a symbol unit. The multiplier 260 multiplies the input information bit a4 by the Walsh code W8 in a symbol unit.

The 5 codewords each comprised of 16 coded symbols, including one codeword being the multiplication result of the remaining one bit of the input information bit stream by 1's signal and four orthogonal codewords output from the multipliers 220 and 260, are provided to the adder 270. The adder 270 XORs the 5 codewords, each comprised of 16 coded symbols output from the multipliers 220–260 in a symbol unit, and outputs one length=16 codeword, i.e., a first order Reed-Muller codeword.

Figure 3:
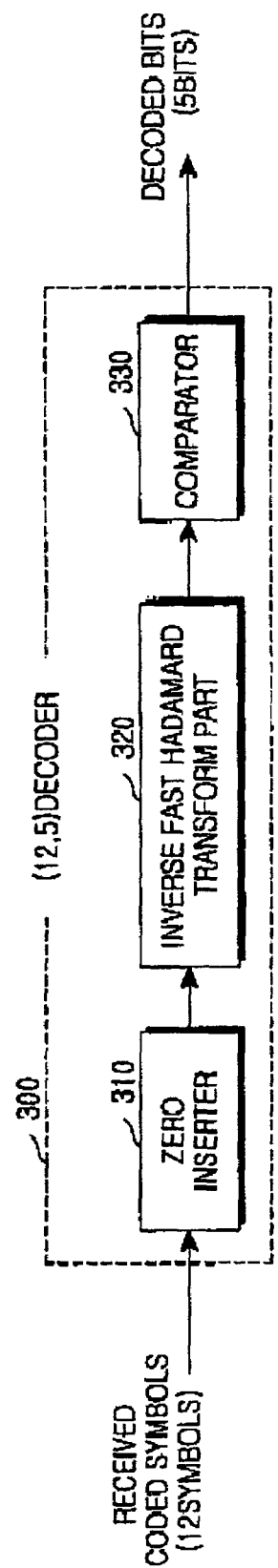
FIG. 3 illustrates a structure of a decoding apparatus according to the first embodiment of the present invention.

FIG. 3 illustrates a structure of a decoding apparatus according to the first embodiment of the present invention. Referring to FIG. 3, a length=12 coded symbol stream received from the transmitter is provided to a zero inserter 310 in a (12,5) decoder 300. The zero inserter 310 receiving the length=12 coded symbol stream inserts zero (0) bits in the puncturing positions used by the puncturer 120 in the (12,5) encoder 100 of the transmitter, and provides the zero-inserted symbol stream to an inverse fast Hadamard transform part 320. For example, if the puncturer 120 in the (12,5) encoder 100 has punctured the $0^{th}$, $3^{rd}$, $6^{th}$ and $9^{th}$ coded symbols, the zero inserter 310 in the (12,5) decoder 300 will insert the zero bits in the above 4 puncturing positions of the length=12 coded symbol stream, and then output a length=16 coded symbol stream. Here, the zero inserter 310 must know the positions where the zero bits are to be inserted, i.e., the puncturing positions used by the puncturer 120. The zero inserter 310 is provided with the puncturing position information from the transmitter in a given procedure. The inverse Hadamard transform part 320 compares the length=16 coded symbol stream output from the zero inserter 310 with first order Reed-Muller codeword to calculate reliabilities there between, and outputs the calculated reliabilities for the first order Reed-Muller codewords and the input information bits for the first order Reed-Muller codewords. Here, all of first order Reed-Muller codewords mean 32 codewords including codewords of the length=16 Walsh code and 16 codewords calculated by inverting the codewords of the length=16 Walsh code. Therefore, 32 reliabilities are calculated. The reliabilities and the input information bits for the first order Reed-Muller codewords make pairs, the number of which is equal to the number of the first order Reed-Muller codewords. The pairs of the reliabilities and the input information bits, output from the inverse Hadamard transform part 320 are provided to a comparator 330. The comparator 330 selects the highest reliability among the provided reliabilities and then outputs the input information bits associated with the selected reliability as decoded bits.

The first embodiment provides 15 other puncturing patterns in addition to the above puncturing pattern {0, 3, 6, 9} for the optimal puncturing positions. When the puncturing pattern is changed, the inserting positions of the zero inserter 310 in the decoder 300 of FIG. 3 are also changed. For example, if the puncturer 120 in the (12,5) encoder 100 punctures consecutive 4 coded symbols beginning at a selected coded symbol out of the $1^{st}$, $3^{rd}$, $5^{th}$, $7^{th}$, $9^{th}$ and $11^{th}$ coded symbols among the 16 coded symbols and outputs an optimal codeword (12,5), the zero inserter 310 in the (12,5) decoder decoding a 12-bit coded symbols stream and outputting a 5-bit coded stream, performs a zero insertion operation as follows. That is, the zero inserter 310 outputs a 16-bit coded symbol stream by inserting zero(0) bits at the positions of the 12-bit coded symbol stream corresponding to positions of 4 consecutive coded symbols beginning at a selected coded symbol out of the $1^{st}$, $3^{rd}$, $5^{th}$, $7^{th}$, $9^{th}$ and $11^{th}$ coded symbols among the 16 coded symbols. Further, the puncturing positions are so determined as to maximize performance of the encoder, and have a simple regularity, so that the encoder in the transmitter and the decoder in the receiver can have low hardware complexity.

Second Embodiment

The second embodiment of the present invention provides a scheme for creating a codeword by using a (24,6) linear code as an optimal error correcting code for the CDMA mobile communication system and then decoding the created (24,6) codeword. For example, the second embodiment uses, as an error correcting code, a (24,6) first order Reed-Muller code obtained by puncturing 8 symbols from 32 coded symbols comprising a first order Reed-Muller codeword with a length 32. Although there are innumerable ways to create the (24,6) first order Reed-Muller code, it is possible not only to minimize hardware complexity, but also to create an optimal codeword by utilizing the method of creating a first order Reed-Muller code and then puncturing the created first order Reed-Muller code as described herein below in the second embodiment of the present invention. A drastic reduction in a length of the first order Reed-Muller code contributes to minimization of the hardware complexity. In addition, it is not only possible to further minimize the hardware complexity but also to create a code optimized for error correcting performance, by puncturing the first order Reed-Muller codeword. As stated above, the embodiment of the present invention uses the first order Reed-Muller code as an error correcting code, and herein, a bi-orthogonal codeword is used for the first order Reed-Muller code.

As stated above, the (24,6) codeword is created by puncturing 8 symbols from 32 coded symbols (bi-orthogonal code symbols) comprising a first order Reed-Muller codeword with a length 32. A minimum distance $d_{min}$ of the codeword depends upon the puncturing positions where the 8 symbols are punctured from the 32 bi-orthogonal code symbols. As previously mentioned, the minimum distance of a codeword refers to the smallest value among the Hamming distance values of the codeword, and an increase in the minimum distance improves error correcting performance of a linear error correcting code. Therefore, it is important to determine proper puncturing positions in order to create a (24,6) bi-orthogonal codeword having excellent error correcting performance in the first order Reed-Muller codeword with a length 32.

Puncturing patterns for determining the 8 puncturing positions needed to create an optimal (24,6) codeword can be experimentally calculated. There are 3 typical puncturing patterns: {2, 5, 8, 11, 14, 17, 20, 21}, {6, 9, 12, 15, 18, 21, 24, 25}, and {10, 13, 16, 19, 22, 25, 28, 29}. A first order Reed-Muller codeword is comprised of 32 coded symbols of $0^{th}$ to $31^{st}$ coded symbols. For example, the puncturing pattern {2, 5, 8, 11, 14, 17, 20, 21} is a puncturing pattern for puncturing, from the stream of the 32 coded symbols comprising the first order Reed-Muller codeword, a $2^{nd}$ coded symbol, puncturing 6 coded symbols at intervals of 3 symbols beginning at the $2^{nd}$ coded symbol, and also puncturing a coded symbol at an interval of 1 symbol beginning at the last symbol out of the 6 punctured coded symbols. The puncturing pattern {6, 9, 12, 15, 18, 21, 24, 25} is a puncturing pattern for puncturing, from the stream of the 32 coded symbols comprising the first order Reed-Muller codeword, a $6^{th}$ coded symbol, puncturing 6 coded symbols at intervals of 3 symbols beginning at the $6^{th}$ coded symbol, and also puncturing a coded symbol at an interval of 1 symbol beginning at the last symbol out of the 6 punctured coded symbols. The puncturing pattern {10, 13, 16, 19, 22, 25, 28, 29} is a puncturing pattern for puncturing, from the stream of the 32 coded symbols comprising the first order Reed-Muller codeword, a $10^{th}$ coded symbol, puncturing 6 coded symbols at intervals of 3 symbols beginning at the $10^{th}$ coded symbol, and also puncturing a coded symbol at an interval of 1 symbol beginning at the last symbol out of the 6 punctured coded symbols. In sum, the puncturing patterns are used to select one of $2^{nd}$, $6^{th}$ and $10^{th}$ coded symbols among the stream of the 32 coded symbols comprising the first order Reed-Muller codeword, and then puncture the selected coded symbol, 6 coded symbols at intervals of 3 symbols beginning at the selected coded symbol, and a coded symbol at an interval of 1 symbol beginning at the last symbol among the 6 punctured coded symbols. If a transmitter of the mobile communication system uses the puncturing patterns having the regularities during coding, a receiver associated with the transmitter should also use the puncturing patterns having the same regularities during decoding by a previous agreement. This agreement is generally prescribed by a communication protocol. However, it is also possible for the transmitter to inform the receiver of the puncturing positions.

Figure 4:
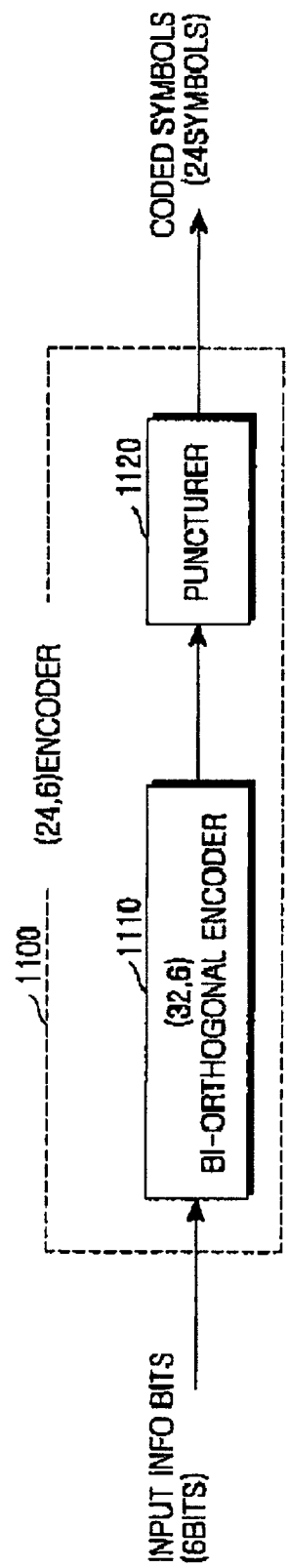
FIG. 4 illustrates a structure of a coding apparatus according to a second embodiment of the present invention.

FIG. 4 illustrates a structure of a coding apparatus according to a second embodiment of the present invention. Referring to FIG. 4, a coding apparatus according to the second embodiment of the present invention realizes a (24,6) encoder 1100 for outputting 24 coded symbols by receiving a 6-bit information bit stream. The (24,6) encoder 1100 includes a (32,6) bi-orthogonal encoder 1110 and a puncturer 1120. The bi-orthogonal encoder (Reed-Muller encoder) 1110 in the (24,6) coding apparatus 1100 encodes 6-bit input information bit stream of a0, a1, a2, a3, a4 and a5 into a first order Reed-Muller codeword (a stream of coded symbols) of length 32. The puncturer 1120 receives the stream of the coded symbols of length 32, output from the bi-orthogonal encoder 1110, and punctures 8 coded symbols at the puncturing positions corresponding to a predetermined puncturing pattern, from the stream of the coded symbols of length 32. As a result, the puncturer 1120 outputs a stream of 24 coded symbols, an optimal (24,6) codeword.

For example, the puncturer 1120 selects one of $2^{nd}$, $6^{th}$ and $10^{th}$ coded symbols among the stream of the 32 coded symbols comprising the first order Reed-Muller codeword, and then punctures the selected coded symbol, 6 coded symbols at intervals of 3 symbols beginning at the selected coded symbol, and a coded symbol at an interval of 1 symbol beginning at the last symbol among the 6 punctured coded symbols. When the $2^{nd}$ coded symbol is selected among the stream of the 32 coded symbols comprising the first order Reed-Muller codeword, the puncturer 1120 punctures $2^{nd}$, $5^{th}$, $8^{th}$, $14^{th}$, $17^{th}$, $20^{th}$ and $21^{st}$ coded symbols. When the $6^{th}$ coded symbol is selected from the stream of the 32 coded symbols comprising the first order Reed-Muller codeword, the puncturer 1120 punctures $6^{th}$, $9^{th}$, $12^{th}$, $15^{th}$, $18^{th}$, $21^{st}$, $24^{th}$ and $25^{th}$ coded symbols. When the $10^{th}$ coded symbol is selected from the stream of the 32 coded symbols comprising the first order Reed-Muller codeword, the puncturer 1120 punctures $10^{th}$, $13^{th}$, $16^{th}$, $19^{th}$, $22^{nd}$, $25^{th}$, $28^{th}$ and $29^{th}$ coded symbols.

Figure 5:
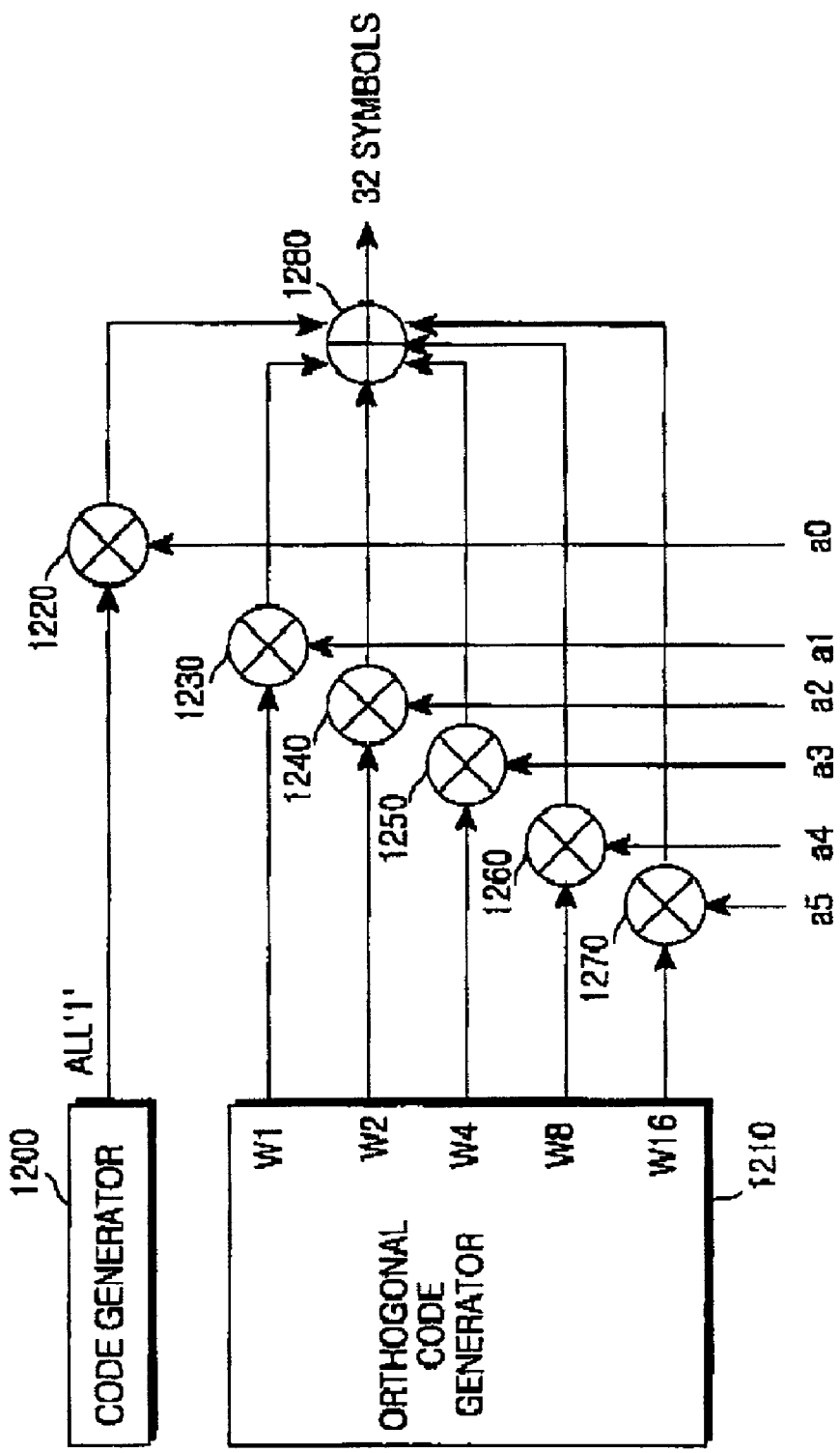
FIG. 5 illustrates a detailed structure of the Reed-Muller encoder shown in FIG. 4.

FIG. 5 illustrates a detailed structure of the Reed-Muller encoder 1110 shown in FIG. 4. Referring to FIG. 5, the Reed-Muller encoder 1110 includes an orthogonal codeword generator comprised of an Orthogonal code generator 1210 and multipliers 1220–1270; an All 1's code generator 1200; and an adder 1280. The orthogonal codeword generator generates orthogonal codewords each comprised of 32 coded symbols by multiplying 5 bits out of the 6-bit input information bit stream by associated base orthogonal codes, a typical orthogonal code, Walsh code W1, W2, W4, W8 and W16, respectively. The orthogonal codeword generator is comprised of the Walsh code generator 1210 for generating a Walsh code, a typical orthogonal code, and the multipliers 1230–1270. The code generator 1200 generates an All 1's code and the All 1's code is multiplied by the remaining one bit of the input information bit stream at the multiplier 1220. The adder 1280 outputs a phase-inverted codeword of the orthogonal codewords, a first order Reed Muller codeword by exclusively ORing (XORing) the codewords output from the multiplier 1220 and the orthogonal codewords.

The 6 input information bits a0, a1, a2, a3 a4 and a5 are provided to the multipliers 1220, 1230, 1240, 1250 1260 and 1270, respectively. The code generator 1200 generates an all 1's code and the Walsh code generator 1210 simultaneously generates length=32 Walsh codes W1, W2, W4, W8 and W16. The all 1's code and the Walsh codes W1, W2, W4, W8 and W16 are also provided to the associated multipliers 1220, 1230, 1240, 1250, 1260 and 1270, respectively. That is, the all 1's code is applied to the multiplier 1220, the Walsh code W1 to the multiplier 1230, the Walsh code W2 to the multiplier 1240, the Walsh code W4 to the multiplier 1250, the Walsh code W8 to the multiplier 1260, and the Walsh code W16 to the multiplier 1270. Here, the code generator 1200 generates the all 1's code in order to create a bi-orthogonal code by converting an orthogonal code to a phase-inverted orthogonal code. Other codes can also be used, if they can be used to create a bi-orthogonal code by converting the orthogonal code to a phase-inverted orthogonal code.

The multiplier 1220 multiplies the input information bit a0 by the all 1's code in a symbol unit. The multiplier 1230 multiplies the input information bit a1 by the Walsh code W1 in a symbol unit. The multiplier 1240 multiplies the input information bit a2 by the Walsh code W2 in a symbol unit. The multiplier 1250 multiplies the input information bit a3 by the Walsh code W4 in a symbol unit. The multiplier 1260 multiplies the input information bit a4 by the Walsh code W8 in a symbol unit. The multiplier 1270 multiplies the input information bit a5 by the Walsh code W16 in a symbol unit.

The 6 codewords each comprised of 32 coded symbols, including one codeword being the multiplication result of the remaining one bit of the input information bit stream by 1's signal and five orthogonal codewords output from the multipliers 1220–1270, are provided to the adder 1280. The adder 1280 XORs the 6 codewords output from the multipliers 1220–1270 in a symbol unit, and outputs one length=32 codeword, i.e., a first order Reed-Muller codeword.

Figure 6:
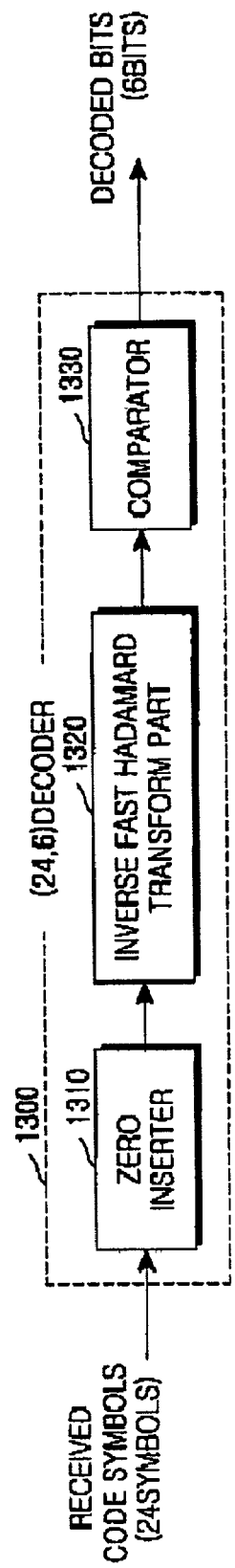
FIG. 6 illustrates a structure of a decoding apparatus according to the second embodiment of the present invention.

FIG. 6 illustrates a structure of a decoding apparatus according to the second embodiment of the present invention. Referring to FIG. 6, a length=24 coded symbol stream received from the transmitter is provided to a zero inserter 1310 in a (24,6) decoder 1300. The zero inserter 1310 receiving the length=24 coded symbol stream inserts zero (0) bits in the puncturing positions used by the puncturer 1120 in the (24,6) encoder 1100 of the transmitter, and provides the zero-inserted symbol stream to an inverse fast Hadamard transform part 1320. For example, if the puncturer 1120 in the (24,6) encoder 1100 has punctured the $2^{nd}$, $5^{th}$, $8^{th}$, $11^{th}$, $14^{th}$, $17^{th}$, $20^{th}$, $21^{st}$ coded symbols, the zero inserter 1310 in the (24,6) decoder 1300 will insert the zero bits in the above 8 puncturing positions of the length=24 coded symbol stream, and then output a length=32 coded symbol stream. Here, the zero inserter 1310 must know the positions where the zero bits are to be inserted, i.e., the puncturing positions used by the puncturer 1120. The zero inserter 1310 is provided with the puncturing position information from the transmitter in a given procedure. The inverse Hadamard transform part 1320 compares the length=32 coded symbol stream output from the zero inserter 1310 with first order Reed-Muller codeword to calculate reliabilities there between, and outputs the calculated reliabilities for the first order Reed-Muller codewords and the input information bits for the first order Reed-Muller codewords. Here, all of first order Reed-Muller codewords means 64 codewords including codewords of length=32 Walsh code and 32 codewords calculated by inverting the length=32 Walsh codewords. Therefore, 64 reliabilities are calculated. The reliabilities and the input information bits for the first order Reed-Muller codewords make pairs, the number of which is equal to the number of the first order Reed-Muller codewords. The pairs of the reliabilities and the input information bits, output from the inverse Hadamard transform part 1320, are provided to a comparator 1330. The comparator 1330 selects the highest reliability among the provided reliabilities and then outputs the input information bits associated with the selected reliability as decoded bits.

The second embodiment provides 2 other puncturing patterns in addition to the above puncturing pattern {2, 5, 8, 11, 14, 17, 20, 21} for the optimal puncturing positions. When the puncturing pattern is changed, the inserting positions of the zero inserter 1310 in the decoder 1300 of FIG. 6 are also changed. For example, if the puncturer 1120 in the (24,6) encoder 1100 outputs an optimal (24,6) codeword by selecting a coded symbol position out of $2^{nd}$, the $6^{th}$ and $10^{th}$ coded symbol position among 32 coded symbols stream and puncturing the selected coded symbol, 6 coded symbol at intervals of 3 beginning at the selected coded symbol and the coded symbol at an interval of 1 beginning at the last symbol out of the 6 coded symbol, the zero inserter 1310 in the (24,6) decoder decoding a 24-bit coded symbol stream and outputting a 6-bit coded stream, performs a zero insertion operation as follows. That is, the zero inserter 310 selects a coded symbol position out of $2^{nd}$, $6^{th}$ and $10^{th}$ coded symbol position among 32 coded symbols stream comprising the first Reed-Muller codeword and outputs a 32-bit coded symbol stream by inserting zero(0) bits at the positions of the 24-bit coded symbol stream corresponding to the selected coded symbol, 6 coded symbols at intervals of 3 beginning at the selected coded symbol and the coded symbol at the interval of 1 beginning at the last symbol of the 6 coded symbols. Further, the puncturing positions are so determined as to maximize performance of the encoder, and have a simple regularity, so that the encoder in the transmitter and the decoder in the receiver can have low hardware complexity.

As described above, the CDMA mobile communication system according to the present invention can obtain an optimal minimum distance by optimally coding/decoding the error correcting codes, thus making it possible to improve error correcting performance. In addition, it is possible to simplify the hardware structure for coding/decoding by determining the puncturing positions with regularity, thus contributing to minimization of the hardware complexity.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An apparatus for coding a 5-bit input information bit stream into a (12,5) codeword comprised of 12 coded symbols, comprising:
    a Reed-Muller encoder for receiving the 5-bit input information bit stream and creating a first order Reed-Muller codeword comprised of 16 coded symbols; and
    a puncturer for outputting an optimal (12,5) codeword by puncturing 4 consecutive coded symbols from a stream of the 16 coded symbols comprising the first order Reed-Muller codeword, beginning at a coded symbol selected from $1^{st}$, $3^{rd}$, $5^{th}$, $7^{th}$, $9^{th}$ and $11^{th}$ coded symbols.

2. The apparatus as claimed in claim 1, wherein the puncturer punctures $1^{st}$, $2^{nd}$, $3^{rd}$ and $4^{th}$ coded symbols.

3. The apparatus as claimed in claim 1, wherein the Reed-Muller encoder comprises:
    an orthogonal codeword generator for generating orthogonal codewords each comprised of 16 coded symbols, by multiplying 4 bits out of the 5-bit input information bit stream by associated base orthogonal codes W1, W2, W4 and W8, respectively;
    a code generator for generating an All 1's code; and
    an adder for outputting the first order Reed-Muller codeword, 16 coded symbols being the phase-inverted codeword of the orthogonal codewords by XORing the result of multiplying a remaining one bit of the input information bit stream by the All 1's code.

4. A method for coding a 5-bit input information bit stream into a (12,5) codeword comprised of 12 coded symbols, comprising the steps of:
    receiving the 5-bit input information bit stream and creating a first order Reed-Muller codeword comprised of 16 coded symbols; and
    outputting an optimal (12,5) codeword by puncturing 4 consecutive coded symbols from a stream of the 16 coded symbols comprising the first order Reed-Muller codeword, beginning at a coded symbol selected out of $1^{st}$, $3^{rd}$, $5^{th}$, $7^{th}$, $9^{th}$ and $11^{th}$ coded symbols.

5. The method as claimed in claim 4, wherein the punctured coded symbols include $1^{st}$, $2^{nd}$, $3^{rd}$ and $4^{th}$ coded symbols.

6. The method as claimed in claim 4, wherein the step of generating he first order Reed-Muller codeword comprises the steps of:
    generating orthogonal codewords, each comprised of 16 coded symbols, by multiplying 4 bits out of the 5-bit input information bit stream by associated base orthogonal codes W1, W2, W4 and W8, respectively;
    multiplying the remaining one bit of the input information bit stream by an All 1's code; and
    outputting the first order Reed-Muller codeword, 16 coded symbols being the phase-inverted codeword of the orthogonal codewords by XORing the result of multiplying a remaining one bit of the input information bit stream by the All 1's code.

7. An apparatus for coding a 5-bit input information bit stream into a (12,5) codeword comprised of 12 coded symbols, comprising:
    a Reed-Muller encoder for receiving the 5-bit input information bit stream and generating a first order Reed-Muller codeword comprised of 16 coded symbols; and
    a puncturer for outputting an optimal (12,5) codeword by puncturing a selected coded symbol out of $2^{nd}$, $3^{rd}$, $6^{th}$ and $7^{th}$ coded symbols from a stream of the 16 coded symbols comprising the first order Reed-Muller codeword, and also puncturing 3 coded symbols at intervals of 2 symbols beginning at the selected coded symbol.

8. The apparatus as claimed in claim 7, wherein the puncturer punctures $2^{nd}$, $4^{th}$, $6^{th}$ and $8^{th}$ coded symbols.

9. The apparatus as claimed in claim 7, wherein the Reed-Muller encoder comprises:
    an orthogonal codeword generator for generating orthogonal codewords, each comprised of 16 coded symbols, by multiplying 4 bits out of the 5-bit input information bit stream by associated base orthogonal codes W1, W2, W4 and W8, respectively;
    a code generator for generating an All 1's code; and
    an adder for outputting the first order Reed-Muller codeword, 16 coded symbols being the phase-inverted codeword of the orthogonal codewords by XORing the orthogonal codewords and the result of multiplying a remaining one bit of the input information bit stream by the All 1's code.

10. A method for coding a 5-bit input information bit stream into a (12,5) codeword comprised of 12 coded symbols, comprising the steps of:
    receiving the 5-bit input information bit stream and generating a first order Reed-Muller codeword comprised of 16 coded symbols; and outputting an optimal (12,5) codeword by puncturing a selected coded symbol out of $2^{nd}$, $3^{rd}$, $6^{th}$ and $7^{th}$ coded symbols from a stream of the 16 coded symbols comprising the first order Reed-Muller codeword, and also puncturing 3 coded symbols at intervals of 2 symbols beginning at the selected coded symbol.

11. The method as claimed in claim 10, wherein the punctured coded symbols include $2^{nd}$, $4^{th}$, $6^{th}$ and $8^{th}$ coded symbols.

12. The method as claimed in claim 10, wherein the step of generating the first order Reed-Muller codeword comprises the steps of:

generating orthogonal codewords, each comprised of 16 coded symbols, by multiplying 4 bits out of the 5-bit input information bit stream by associated base orthogonal codes W1, W2, W4 and W8, respectively;

multiplying the remaining one bit of the input information bit stream by an All 1's code; and outputting the first order Reed-Muller codeword, 16 coded symbols being the phase-inverted codeword of the orthogonal codewords by XORing the orthogonal codewords and the result of multiplication.

13. An apparatus for coding a 5-bit input information bit stream into a (12,5) codeword comprised of 12 coded symbols, comprising:

a Reed-Muller encoder for receiving the 5-bit input information bit stream and generating a first order Reed-Muller codeword comprised of 16 coded symbols; and a puncturer for outputting an optimal (12,5) codeword by puncturing a selected coded symbol out of $0^{th}$, $1^{st}$, $2^{nd}$, $4^{th}$, $5^{th}$ and $6^{th}$ coded symbols from a stream of the 16 coded symbols comprising the first order Reed-Muller codeword, and also puncturing 3 coded symbols at intervals of 3 symbols beginning at the selected coded symbol.

14. The apparatus as claimed in claim 13, wherein the puncturer punctures $0^{th}$, $3^{rd}$, $6^{th}$ and $9^{th}$ coded symbols.

15. The apparatus as claimed in claim 13, wherein the Reed-Muller encoder comprises:

an orthogonal codeword generator for generating orthogonal codewords, each comprised of 16 coded symbols, by multiplying 4 bits out of the 5-bit input information bit stream by associated base orthogonal codes W1, W2, W4 and W8, respectively;

a code generator for generating an All 1's code; and an adder for outputting the first order Reed-Muller codeword, 16 coded symbols being the phase-inverted codeword of the orthogonal codewords by XORing the orthogonal codewords and the result of multiplying a remaining one bit of the input information bit stream by the All 1's code.

16. A method for coding a 5-bit input information bit stream into a (12,5) codeword comprised of 12 coded symbols, comprising the steps of:

receiving the 5-bit input information bit stream and generating a first order Reed-Muller codeword comprised of 16 coded symbols; and outputting an optimal (12,5) codeword by puncturing a selected coded symbol out of $0^{th}$, $1^{st}$, $2^{nd}$, $4^{th}$, $5^{th}$ and $6^{th}$ coded symbols from a stream of the 16 coded symbols comprising the first order Reed-Muller codeword, and also puncturing 3 coded symbols at intervals of 3 symbols beginning at the selected coded symbol.

17. The method as claimed in claim 16, wherein the punctured coded symbols include $0^{th}$, $3^{rd}$, $6^{th}$ and $9^{th}$ coded symbols.

18. The method as claimed in claim 16, wherein the step of generating the first order Reed-Muller codeword comprises the steps of:

generating orthogonal codewords, each comprised of 16 coded symbols, by multiplying 4 bits out of the 5-bit input information bit stream by associated base orthogonal codes W1, W2, W4 and W8, respectively;

multiplying the remaining one bit of the input information bit stream by an All 1's code; and outputting the first order Reed-Muller codeword, 16 coded symbols being the phase-inverted codeword of the orthogonal codewords by XORing the orthogonal codewords and the result of multiplication.

19. An apparatus for coding a 6-bit input information bit stream into a (24,6) codeword comprised of 24 coded symbols, comprising:

a Reed-Muller encoder for receiving the 6-bit input information bit stream and generating a first order Reed-Muller codeword comprised of 32 coded symbols; and a puncturer for outputting an optimal (24,6) codeword by selecting a coded symbol out of $2^{nd}$, $6^{th}$ and $10^{th}$ coded symbols from a stream of the 32 coded symbols comprising the first order Reed-Muller codeword, and puncturing the selected coded symbol, 6 coded symbols at intervals of 3 symbols beginning at the selected coded symbol, and a coded symbol at an interval of 1 symbol beginning at a last symbol out of the 6 punctured coded symbols.

20. The apparatus as claimed in claim 19, wherein the puncturer punctures $2^{nd}$, $5^{th}$, $8^{th}$, $11^{th}$, $14^{th}$, $17^{th}$, $20^{th}$ and $21^{th}$ coded symbols.

21. The apparatus as claimed in claim 19, wherein the Reed-Muller encoder comprises:

an orthogonal codeword generator for generating orthogonal codewords, each comprised of 32 coded symbols, by multiplying 5 bits out of the 6-bit input information bit stream by associated base orthogonal codes W1, W2, W4, W8 and W16, respectively;

a code generator for generating an All 1's code; and an adder for outputting the first order Reed-Muller codeword, 32 coded symbols being the phase-inverted codeword of the orthogonal codewords by XORing the orthogonal codewords and the result of multiplying a remaining one bit of the input information bit stream by the All 1's code.

22. A method for coding a 6-bit input information bit stream into a (24,6) codeword comprised of 24 coded symbols, comprising the steps of:

receiving the 6-bit input information bit stream and generating a first order Reed-Muller codeword comprised of 32 coded symbols; and outputting an optimal (24,6) codeword by selecting a coded symbol out of $2^{nd}$, $6^{th}$ and $10^{th}$ coded symbols from a stream of the 32 coded symbols comprising the first order Reed-Muller codeword, and puncturing the selected coded symbol, 6 coded symbols at intervals of 3 symbols beginning at the selected coded symbol, and a coded symbol at an interval of 1 symbol beginning at a last symbol out of the 6 punctured coded symbols.

23. The method as claimed in claim 22, wherein the punctured coded symbols include $2^{nd}$, $5^{th}$, $8^{th}$, $11^{th}$, $14^{th}$, $17^{th}$, $20^{th}$ and $21^{st}$ coded symbols.

24. The method as claimed in claim 22, wherein the step of generating the first order Reed-Muller codeword comprises the steps of:
  generating orthogonal codewords, each comprised of 32 coded symbols, by multiplying 5 bits out of the 6-bit input information bit stream by associated base orthogonal codes W1, W2, W4, W8 and W16, respectively;
  multiplying the remaining one bit of the input information bit stream by an All 1's code; and
  outputting the first order Reed-Muller codeword, 32 coded symbols being the phase-inverted codeword of the orthogonal codewords by XORing the orthogonal codewords and the result of multiplication.

25. A (12,5) decoding apparatus for decoding a 12-bit coded symbol stream into a 5-bit decoded bit stream, comprising:
  a zero inserter for outputting a 16-bit coded symbol stream by inserting zero (0) bits at positions of the 12-bit coded symbol stream corresponding to positions of 4 consecutive coded symbols beginning at a selected coded symbol out of $1^{st}, 3^{rd}, 5^{th}, 7^{th}, 9^{th}$ and $11^{th}$ coded symbols among the 16 coded symbols comprising a first order Reed-Muller codeword;
  an inverse Hadamard transform part for calculating reliabilities by comparing the 16-bit coded symbol stream with every first order Reed-Muller codewords, each comprised of the 16-bit coded symbol stream, and outputting 5-bit information bit streams corresponding to all of the first order Reed-Muller codewords along with associated reliability values; and
  a comparator for comparing reliabilities for all of the first order Reed-Muller codewords, and outputting a 5-bit information bit stream corresponding to a first order Reed-Muller codeword having a highest reliability as a decoded bit stream.

26. A (12,5) decoding method for decoding a 12-bit coded symbol stream into a 5-bit decoded bit stream, comprising the steps of;
  outputting a 16-bit coded symbol stream by inserting zero (0) bits at positions of the 12-bit coded symbol stream corresponding to positions of 4 consecutive coded symbols beginning at a selected coded symbol out of $1^{st}, 3^{rd}, 5^{th}, 7^{th}, 9^{th}$ and $11^{th}$ coded symbols among the 16 coded symbols comprising a first order Reed-Muller codeword
  calculating reliabilities by comparing the 16-bit coded symbol stream with every first order Reed-Muller codewords, each comprised of the 16-bit coded symbol stream, and outputting 5-bit information bit streams corresponding to all of the first order Reed-Muller codewords along with associated reliability values; and
  comparing the reliabilities of all of the first order Reed-Muller codewords, and outputting a 5-bit information bit stream corresponding to a first Reed-Muller codeword having a highest reliability as a decoded bit stream.

27. A (24,6) decoding apparatus for decoding a 24-bit coded symbol stream into a 6-bit decoded bit stream comprising;
  a zero inserter for outputting a 32-bit coded symbol by selecting a coded symbol out of $2^{nd}, 6^{th}$ and $10^{th}$ coded symbols from a stream of 32 coded symbols comprising the first order Reed-Muller codeword and inserting zero(0) bits at positions of the 24-bit coded symbol stream corresponding to the position of the coded symbol at the selected position, the position of 6 coded symbols at the position having 3 intervals beginning at the selected coded symbol and the position of coded symbol at the position having 1 interval beginning at the last symbol of the 6 coded symbols;
  an inverse Hadamard transform part for calculating reliabilities by comparing the 32-bit coded symbol stream with every first order Reed-Muller codewords, each comprised of the 16-bit coded symbol stream, and outputting 6-bit information bit streams corresponding to all of the first order Reed-Muller codewords along with associated reliability values; and
  a comparator for comparing reliabilities for all of the first order Reed-Muller codewords, and outputting a 6-bit information bit stream corresponding to a first order Reed-Muller codeword having a highest reliability as a decoded bit stream.

28. A (24,6) decoding method for decoding a 24-bit coded symbol stream into a 6-bit decoded bit stream, comprising the steps of;
  outputting a 32-bit coded symbol by selecting a coded symbol out of $2^{nd}, 6^{th}$ and $10^{th}$ coded symbols from a stream of 32 coded symbols comprising the first order Reed-Muller codeword and inserting zero(0) bits at positions of the 24-bit coded symbol stream corresponding to the position of the coded symbol at the selected position, the position of 6 coded symbols at the position having 3 intervals beginning at the selected coded symbol and the position of coded symbol at the position having 1 interval beginning at the last symbol of the 6 coded symbols;
  calculating reliabilities by comparing the 32-bit coded symbol stream with every first order Reed-Muller codewords, each comprised of the 16-bit coded symbol stream, and outputting 6-bit information bit streams corresponding to all of the first order Reed-Muller codewords along with associated reliability values; and
  comparing reliabilities for all of the first order Reed-Muller codewords, and outputting a 6-bit information bit stream corresponding to a first order Reed-Muller codeword having a highest reliability as a decoded bit stream.

* * * * *